(12) United States Patent  
Park et al.

(10) Patent No.: US 8,592,973 B2
(45) Date of Patent: Nov. 26, 2013

(54) INTEGRATED CIRCUIT PACKAGING SYSTEM WITH PACKAGE-ON-PACKAGE STACKING AND METHOD OF MANUFACTURE THEREOF

(75) Inventors: HyungSang Park, Hanam-si (KR); DeokKyung Yang, Hanam-si (KR); DaeSik Choi, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 223 days.

(21) Appl. No.: 12/580,933

(22) Filed: Oct. 16, 2009

(65) Prior Publication Data

US 2011/0089552 A1    Apr. 21, 2011

(51) Int. Cl.
*H01L 23/34* (2006.01)

(52) U.S. Cl.
USPC ............ 257/723; 257/724; 257/725; 438/112

(58) Field of Classification Search
USPC .......... 257/723, 724, 725, E23.062, E23.063; 438/112
See application file for complete search history.

(56) References Cited

U.S. PATENT DOCUMENTS

| | | | |
|---|---|---|---|
| 7,351,068 B2 * | 4/2008 | Sukegawa et al. | 439/66 |
| 7,494,844 B2 | 2/2009 | Jung et al. | |
| 7,535,086 B2 | 5/2009 | Merilo et al. | |
| 7,550,680 B2 | 6/2009 | Pendse | |
| 7,553,752 B2 | 6/2009 | Kuan et al. | |
| 7,573,139 B2 | 8/2009 | Gerber et al. | |
| 7,578,676 B2 * | 8/2009 | Sukegawa et al. | 439/66 |
| 7,812,446 B2 * | 10/2010 | Kurita | 257/725 |
| 7,901,986 B2 * | 3/2011 | Arai et al. | 438/108 |
| 8,063,475 B2 * | 11/2011 | Choi et al. | 257/686 |
| 2004/0173914 A1 * | 9/2004 | Kurihara et al. | 257/778 |
| 2006/0263937 A1 * | 11/2006 | Fukase et al. | 438/108 |
| 2008/0105962 A1 | 5/2008 | Lee et al. | |
| 2008/0268210 A1 * | 10/2008 | Sunohara | 428/195.1 |
| 2009/0001612 A1 * | 1/2009 | Song et al. | 257/787 |
| 2010/0065948 A1 | 3/2010 | Bae et al. | |
| 2010/0078789 A1 | 4/2010 | Choi et al. | |
| 2010/0148344 A1 * | 6/2010 | Chandra et al. | 257/690 |
| 2010/0320591 A1 * | 12/2010 | Camacho et al. | 257/692 |
| 2010/0320619 A1 * | 12/2010 | Ko et al. | 257/777 |
| 2011/0037157 A1 * | 2/2011 | Shin et al. | 257/686 |
| 2011/0115098 A1 * | 5/2011 | Song et al. | 257/777 |
| 2011/0171756 A1 * | 7/2011 | Andry et al. | 438/4 |
| 2011/0180317 A1 * | 7/2011 | Takahashi et al. | 174/537 |
| 2011/0210444 A1 * | 9/2011 | Jeng et al. | 257/738 |
| 2011/0233726 A1 * | 9/2011 | Huang et al. | 257/532 |

* cited by examiner

*Primary Examiner* — Ngan Ngo

(74) *Attorney, Agent, or Firm* — Ishimaru & Associates LLP

(57) ABSTRACT

A method of manufacture of an integrated circuit packaging system including: forming a top package including: providing a through silicon via interposer having a through silicon via; coupling a stacked integrated circuit die to the through silicon via, and testing a top package; forming a base package including: providing a substrate, coupling a base integrated circuit die to the substrate, and testing a base package; and coupling a stacked interconnect between the top package and the base package.

20 Claims, 9 Drawing Sheets

INTEGRATED CIRCUIT PACKAGING SYSTEM WITH PACKAGE-ON-PACKAGE STACKING AND METHOD OF MANUFACTURE THEREOF

TECHNICAL FIELD

The present invention relates generally to an integrated circuit packaging system, and more particularly to a system for package-on-package stacking.

BACKGROUND ART

When semiconductor chips are to be mounted on substrates or interposers to form today's semiconductor packages, the substrates and interposers are commonly made of plastic or ceramic materials. These materials are especially preferred when the chip assembly technique employs the flip-chip method using solder balls to create the electrical connections between the chips and the substrate/interposer. When the assembled devices are then used or tested under conditions, which impose wide swings of temperature or humidity on the packages, significant failure rates may appear, characterized by cracks, especially at the solder joints, and delamination of the package parts.

Driven by the desire to reduce the board area needed to assemble a semiconductor device into electronic products such as hand-held telephones, today's semiconductor devices often use vertically stacked chips inside the packages. These chip stacks frequently include chips of significantly different sizes, assembled mostly by wire bonding techniques on interposers made of plastic or ceramic materials. The stack on the interposer is then assembled on substrates with solder balls for interconnection to external parts. The reliability failure rates due to solder joint cracks or parts delamination, observed for these devices under conditions of temperature cycles and high humidity, are especially high.

In order to interface an integrated circuit with other circuitry, it is common to mount it on a lead frame or substrate. Each integrated circuit has bonding pads that are individually connected to the lead frame's lead finger pads using extremely fine gold or aluminum wires. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as PC's, compute servers, and storage servers, need more integrated circuits in the same or smaller "real estate". Particularly acute, the needs for portable personal electronics, such as cell phones, digital cameras, music players, PDA's, and location-based devices, have further driven the need for integrated circuit density.

This increased integrated circuit density, has led to the development of multi-chip packages in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a PCB substrate onto which a set of separate integrated circuit components is directly attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. Moreover the substrate and integrated circuit are often damaged during assembly or testing, complicating the manufacturing process and increasing costs. The vertically stacked integrated circuit problems can be greater than the benefits.

There are design limitations presented by package stacks as well. In many of the stacked structures, the top package is not able to have system interconnects in the center as this area is usually consumed by the plastic package cover of the lower device. In the push for more integrated function, this limitation may stop a design from using the package type. Package overlaps have long been a barrier to additional interconnects, which can be a problem in a device that has a high number of interconnects around the outside of the package.

Thus, a need still remains for an integrated circuit packaging system with package-on-package stacking that can provide smaller and reliable packages with high yields. In view of the shrinking size of consumer electronics and the demand for more sophisticated functions in the restricted space, it is increasingly critical that answers be found to these problems. In view of the ever increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a top package including: providing a through silicon via interposer having a through silicon via; coupling a stacked integrated circuit die to the through silicon via, and testing a top package; forming a base package including: providing a substrate, coupling a base integrated circuit die to the substrate, and testing a base package; and coupling a stacked interconnect between the top package and the base package.

The present invention provides an integrated circuit packaging system includes: a top package includes: a through silicon via interposer having a through silicon via, and a stacked integrated circuit die coupled to the through silicon via; forming a base package includes: a substrate, and a base integrated circuit die coupled to the substrate; and a stacked interconnect between the top package and the base package.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
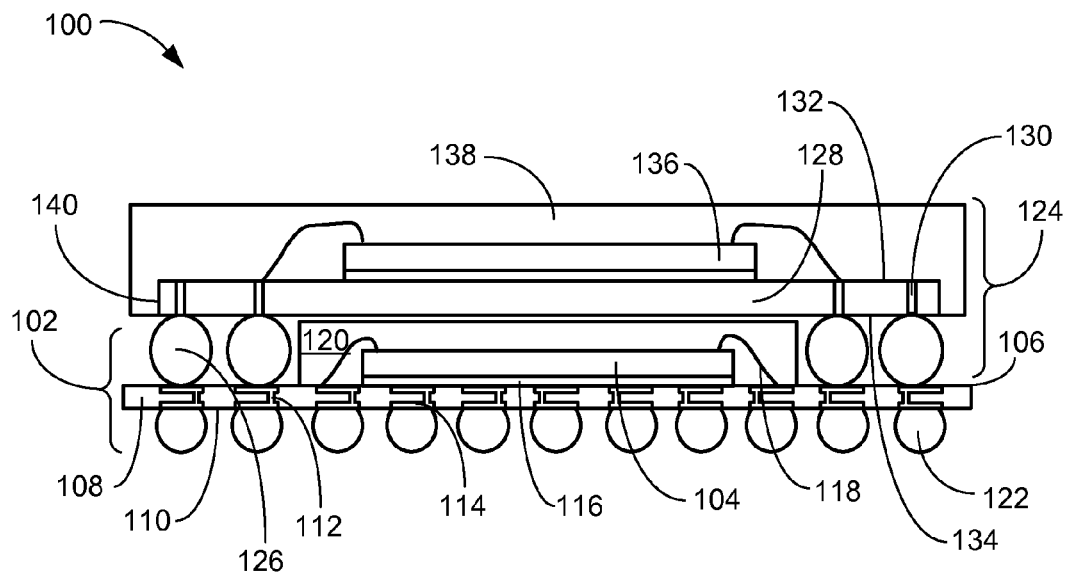
FIG. 1 is a cross-sectional view of an integrated circuit packaging system with package-on-package stacking, in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the through silicon via interposer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit packaging system 100 with package-on-package stacking, in a first embodiment of the present invention. The cross-sectional view of the integrated circuit packaging system 100 with package-on-package stacking depicts a base package 102, such as a die up plastic ball grid array (PBGA), having a base integrated circuit die 104 mounted on a component side 106 of a substrate 108.

The substrate 108, such as a laminate substrate or ceramic substrate, has a system side 110 with vias 112 coupling contacts 114 on the system side 110 to the contacts 114 on the component side 106. The base integrated circuit die 104 may be mounted on the component side 106 by an adhesive 116, such as a die attach material.

Electrical interconnects 118, such as bond wires, may couple the base integrated circuit die 104 to the contacts 114 on the component side 106. A molded base package body 120 may encapsulate the base integrated circuit die 104, the electrical interconnects 118, and a portion of the component side 106. Some of the contacts 114 on the component side 106 remain exposed.

System interconnects 122, such as solder balls, solder bumps, solder columns, or stud bumps, may be formed on the contacts 114 of the system side 110 of the substrate 108. The system interconnects 122 may be electrically connected to the contacts 114 on the component side 106, the base integrated circuit die 104, or a combination thereof.

A top package 124 may include stacked interconnects 126, such as solder balls, solder columns, or stud bumps. A through silicon via interposer 128, such as an integrated circuit die having through silicon vias 130 may be coupled to the stacked interconnects 126. The through silicon via interposer 128 may have an active side 132 and a back side 134. The active side 132 of the through silicon via interposer 128 may include integrated circuits (not shown).

A stacked integrated circuit die 136 may be mounted on the active side 132 by the adhesive 116. The electrical interconnects 118 may couple the stacked integrated circuit die 136 to the through silicon vias 130 on the active side 132. The resulting circuit may electrically connect the stacked integrated circuit die 136, the through silicon via interposer 128, the base integrated circuit die 104, the system interconnects 122, or a combination thereof.

A top package body 138 may be formed by molding an epoxy molding compound to encapsulate the stacked integrated circuit die 136, the electrical interconnects 118, as well as the active side 132 and vertical sides 140 of the through silicon via interposer 128. The top package body 138 leaves the back side 134 of the through silicon via interposer 128 exposed.

It has been discovered that the top package 124 may reduce the thickness of the integrated circuit packaging system 100 by removing the necessity for a substrate on the top package 124. The through silicon via interposer 128 may provide an attaching surface to electrically connect the top package 124 to other devices. The top package 124 and the base package 102 can be tested prior to assembly, which improves manufacturing yields and reduces the cost.

The number and location of the stacked integrated circuit die 136 and the base integrated circuit die 104 is an example only and other configurations are possible. In each case multiple die may be stacked within the packages.

Figure 2:
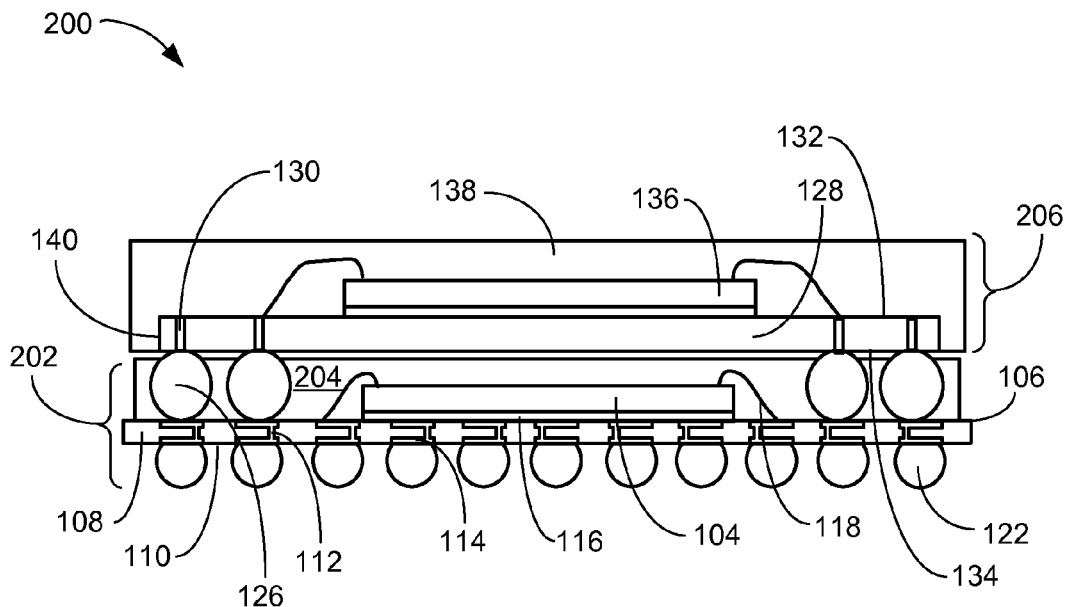
FIG. 2 is a cross-sectional view of an integrated circuit packaging system with package-on-package stacking, in a second embodiment of the present invention.

Referring now to FIG. 2, therein is shown a cross-sectional view of an integrated circuit packaging system 200 with package-on-package stacking, in a second embodiment of the present invention. The cross-sectional view of the integrated circuit packaging system 200 depicts a base package 202 having the base integrated circuit die 104 mounted on the component side 106 of the substrate 108.

The substrate 108, such as a laminate substrate or ceramic substrate, has the system side 110 with the vias 112 coupling the contacts 114 on the system side 110 to the contacts 114 on the component side 106. The base integrated circuit die 104 may be mounted on the component side 106 by the adhesive 116, such as a die attach material.

The electrical interconnects 118, such as bond wires, may couple the base integrated circuit die 104 to the contacts 114 on the component side 106. The stacked interconnects 126, such as solder balls, solder columns, or stud bumps, may be mounted on the contacts 114 of the component side 106 as well. A molded base package body 204 may encapsulate the base integrated circuit die 104, the electrical interconnects 118, the stacked interconnects 126, and a portion of the component side 106. None of the contacts 114 on the component side 106 remain exposed but the top of the stacked interconnects 126 may protrude through the molded base package body 204 for further connection.

The system interconnects 122, such as solder balls, solder bumps, solder columns, or stud bumps, may be formed on the contacts 114 of the system side 110 of the substrate 108. The system interconnects 122 may be electrically connected to the contacts 114 on the component side 106, the base integrated circuit die 104, or the combination thereof.

A top package 206 may be coupled to the substrate 108 of the base package 202 through the stacked interconnects 126 by the through silicon via interposer 128, such as an integrated circuit die, having the through silicon vias 130 coupled on the stacked interconnects 126, which are on the substrate 108. The through silicon via interposer 128 may have the active side 132 and the back side 134. The active side 132 of the through silicon via interposer 128 may include integrated circuits (not shown).

The stacked integrated circuit die 136 may be mounted on the active side 132 by the adhesive 116. The electrical interconnects 118 may couple the stacked integrated circuit die 136 to the through silicon vias 130 on the active side 132. The resulting circuit may electrically connect the stacked integrated circuit die 136, the through silicon via interposer 128, the base integrated circuit die 104, the system interconnects 122, or a combination thereof.

The top package body 138 may be formed by molding an epoxy molding compound to encapsulate the stacked integrated circuit die 136, the electrical interconnects 118, as well as the active side 132 and the vertical sides 140 of the through silicon via interposer 128. The top package body 138 leaves the back side 134 of the through silicon via interposer 128 exposed.

The top package 206 and the base package 202 can be tested prior to assembly, which improves manufacturing yields and reduces the cost. It has been discovered that by encasing the stacked interconnects 126 within the molded base package body 204, the fragility of the packages may be reduced prior to assembly.

Figure 3:
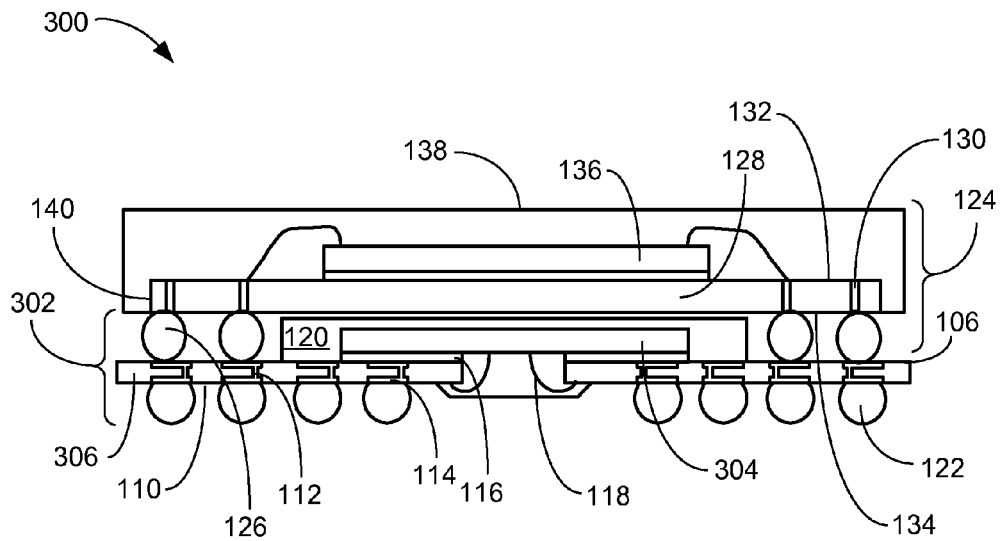
FIG. 3 is a cross-sectional view of an integrated circuit packaging system with package-on-package stacking, in a third embodiment of the present invention.

Referring now to FIG. 3, therein is shown a cross-sectional view of an integrated circuit packaging system 300 with package-on-package stacking, in a third embodiment of the present invention. The cross-sectional view of the integrated circuit packaging system 300 depicts a base package 302, such as a die down plastic ball grid array (PBGA), having a base integrated circuit die 304 mounted on the component side 106 of a substrate 306 having an opening.

The substrate 306, such as a laminate substrate or ceramic substrate, has the system side 110 with the vias 112 coupling the contacts 114 on the system side 110 to the contacts 114 on the component side 106. The base integrated circuit die 304 may be mounted on the component side 106 by the adhesive 116, such as a die attach material, in an active side down position.

The electrical interconnects 118, such as bond wires, may couple the base integrated circuit die 304 to the contacts 114 on the system side 110 through the opening. The molded base package body 120 may encapsulate the base integrated circuit die 304, the electrical interconnects 118, and a portion of the component side 106. Some of the contacts 114 on the component side 106 remain exposed.

The system interconnects 122, such as solder balls, solder bumps, solder columns, or stud bumps, may be formed on the contacts 114 of the system side 110 of the substrate 108. The system interconnects 122 may be electrically connected to the contacts 114 on the component side 106, the base integrated circuit die 104, or a combination thereof.

The top package 124 may include the stacked interconnects 126, such as solder balls, solder columns, or stud bumps. The through silicon via interposer 128, such as an integrated circuit die having the through silicon vias 130 may be coupled to the stacked interconnects 126. The through silicon via interposer 128 may have the active side 132 and the back side 134. The active side 132 of the through silicon via interposer 128 may include integrated circuits (not shown).

The stacked integrated circuit die 136 may be mounted on the active side 132 by the adhesive 116. The electrical interconnects 118 may couple the stacked integrated circuit die 136 to the through silicon vias 130 on the active side 132. The resulting circuit may electrically connect the stacked integrated circuit die 136, the through silicon via interposer 128, the base integrated circuit die 304, the system interconnects 122, or a combination thereof.

The top package body 138 may be formed by molding an epoxy molding compound to encapsulate the stacked integrated circuit die 136, the electrical interconnects 118, as well as the active side 132 and the vertical sides 140 of the through silicon via interposer 128. The top package body 138 leaves the back side 134 of the through silicon via interposer 128 exposed.

Figure 4:
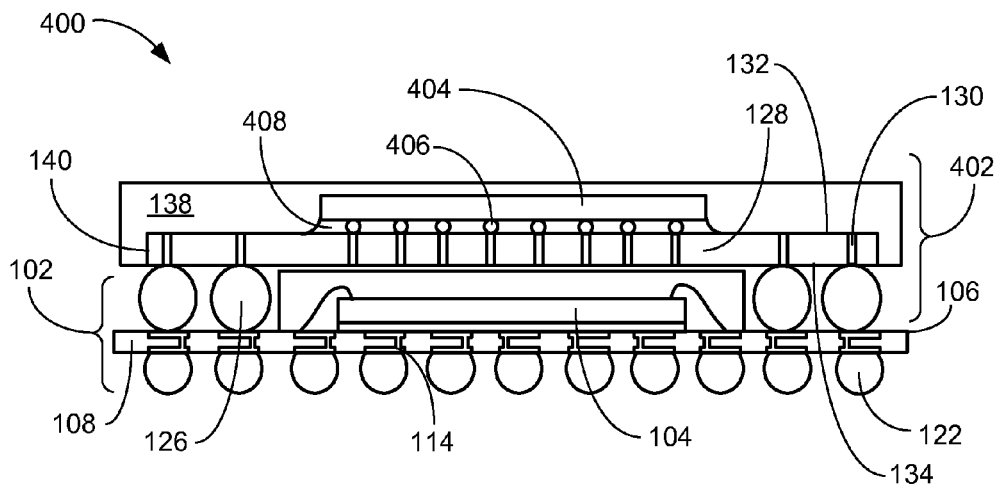
FIG. 4 is a cross-sectional view of an integrated circuit packaging system with package-on-package stacking, in a fourth embodiment of the present invention.

Referring now to FIG. 4, therein is shown a cross-sectional view of an integrated circuit packaging system 400 with package-on-package stacking, in a fourth embodiment of the present invention. The cross-sectional view of the integrated circuit packaging system 400 depicts the base package 102 with a top package 402 attached to the contacts 114 on the component side 106 of the substrate 108 by the stacked interconnects 126.

The top package 402 may include the stacked interconnects 126, such as solder balls, solder columns, or stud bumps. The through silicon via interposer 128, such as an integrated circuit die, having the through silicon vias 130 may be attached to the stacked interconnects 126. The through silicon via interposer 128 may have the active side 132 and the back side 134. The active side 132 of the through silicon via interposer 128 may include integrated circuits (not shown).

A stacked integrated circuit die 404, such as a flip chip integrated circuit die, may be mounted on the active side 132 by chip interconnects 406. An underfill material 408 may be applied between the active side 132 and the stacked integrated circuit die 404. The stacked integrated circuit die 404 may be coupled through the through silicon vias 130 on the active side 132. The resulting circuit may electrically connect the stacked integrated circuit die 404, the through silicon via interposer 128, the base integrated circuit die 104, the system interconnects 122, or a combination thereof.

The top package body 138 may be formed by molding an epoxy molding compound to encapsulate the stacked integrated circuit die 136, the electrical interconnects 118, as well as the active side 132 and the vertical sides 140 of the through silicon via interposer 128. The top package body 138 leaves the back side 134 of the through silicon via interposer 128 exposed.

Figure 5:
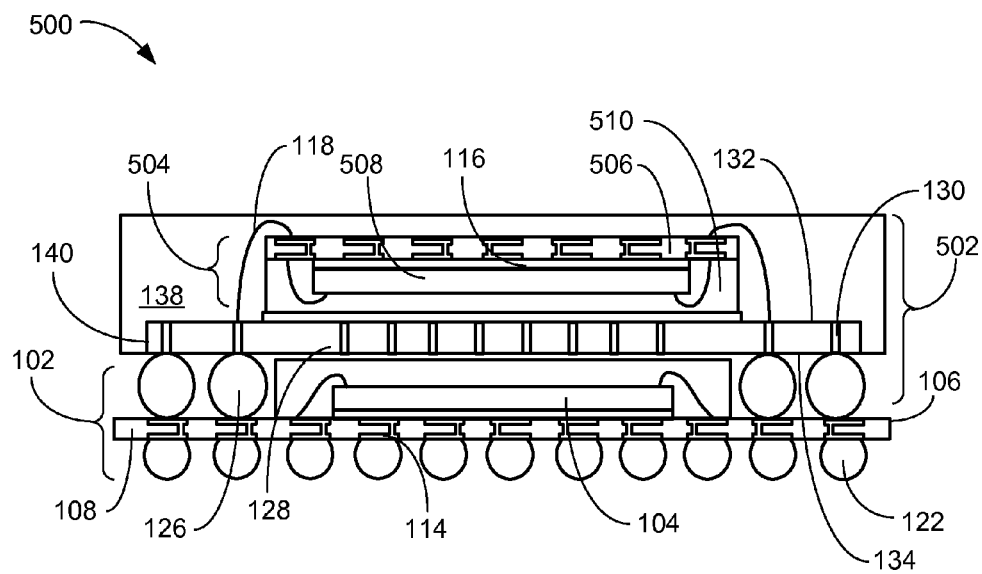
FIG. 5 is a cross-sectional view of an integrated circuit packaging system with package-on-package stacking, in a fifth embodiment of the present invention.

Referring now to FIG. 5, therein is shown a cross-sectional view of an integrated circuit packaging system 500 with package-on-package stacking, in a fifth embodiment of the present invention. The cross-sectional view of the integrated circuit packaging system 500 depicts the base package 102 with a top package 502 coupled to the contacts 114 on the component side 106 of the substrate 108 by the stacked interconnects 126.

The top package 502 may include the stacked interconnects 126, such as solder balls, solder columns, or stud bumps. The through silicon via interposer 128, such as an integrated circuit die, having the through silicon vias 130 may be coupled to the stacked interconnects 126. The through silicon via interposer 128 may have the active side 132 and the back side 134. The active side 132 of the through silicon via interposer 128 may include integrated circuits (not shown).

A stacked integrated package 504 may be mounted on the active side 132 by the adhesive 116. The stacked integrated package 504, such as a plastic ball grid array, may be applied in a top down configuration on the active side 132.

The stacked integrated package 504 may include a stacked substrate 506, substantially similar to the substrate 108 of the base package 102. A stacked integrated circuit die 508 may be mounted on the stacked substrate 506 by the adhesive 116. The electrical interconnects 118 may couple the stacked integrated circuit die 508 to the stacked substrate 506. An integrated package body 510 may be formed by applying a molding compound on the stacked integrated circuit die 508, the stacked substrate 506, and the electrical interconnects 118.

The stacked integrated package 504 may be coupled by the electrical interconnects 118 to the through silicon vias 130 on the active side 132. The resulting circuit may electrically connect the stacked integrated circuit die 508, the through silicon via interposer 128, the base integrated circuit die 104, the system interconnects 122, or a combination thereof.

The top package body 138 may be formed by molding an epoxy molding compound to encapsulate the stacked integrated circuit die 136, the electrical interconnects 118, as well as the active side 132 and the vertical sides 140 of the through silicon via interposer 128. The top package body 138 leaves the back side 134 of the through silicon via interposer 128 exposed.

Figure 6:
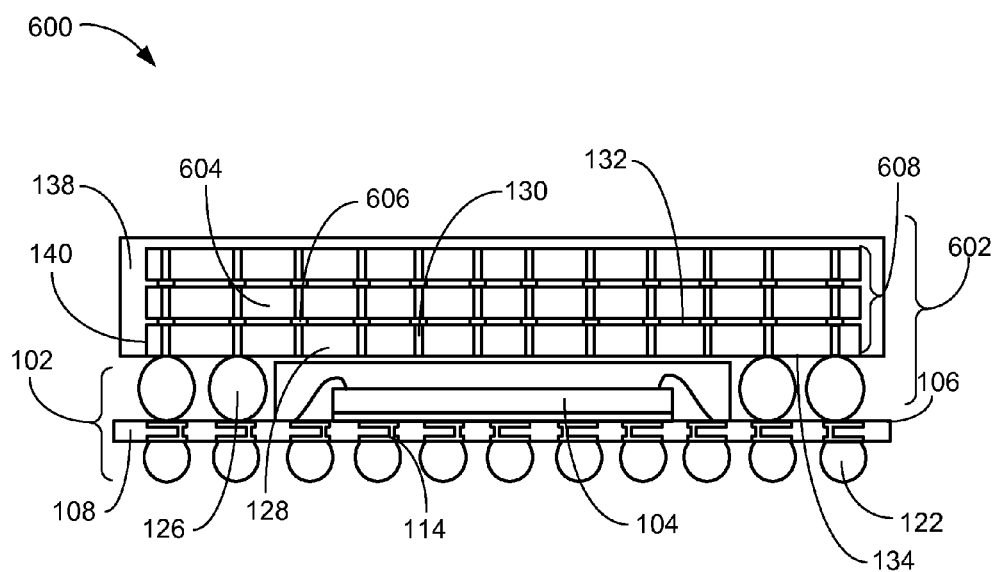
FIG. 6 is a cross-sectional view of an integrated circuit packaging system with package-on-package stacking, in a sixth embodiment of the present invention.

Referring now to FIG. 6, therein is shown a cross-sectional view of an integrated circuit packaging system 600 with package-on-package stacking, in a sixth embodiment of the present invention. The cross-sectional view of the integrated circuit packaging system 600 depicts the base package 102 with a top package 602 coupled to the contacts 114 on the component side 106 of the substrate 108 by the stacked interconnects 126.

The top package 602 may include the stacked interconnects 126, such as solder balls, solder columns, or stud bumps. The through silicon via interposer 128, such as an integrated circuit die, having the through silicon vias 130 may be coupled to the stacked interconnects 126. The through silicon via interposer 128 may have the active side 132 and the back side 134. The active side 132 of the through silicon via interposer 128 may include integrated circuits (not shown).

An additional through silicon via interposer 604 may be coupled to the through silicon via interposer 128 by interposer interconnects 606, such as solder balls or solder bumps. The additional through silicon via interposer 604 may be electrically connected to the through silicon via interposer 128, the base integrated circuit die 104, the system interconnects 122, or a combination thereof. A through silicon via interposer stack 608 may provide an array of the through silicon via interposer 128 within the top package 602.

The top package body 138 may be formed by molding an epoxy molding compound to encapsulate the additional through silicon via interposer 604, the interposer interconnects 606, as well as the active side 132 and the vertical sides 140 of the through silicon via interposer 128. The top package body 138 leaves the back side 134 of the through silicon via interposer 128 exposed.

While the FIG. 6 shows three of the through silicon via interposer 128 forming the through silicon via interposer stack 608, it is understood that this is an example only and a different number of the through silicon via interposer 128 could be implemented. It has been discovered that the through silicon via interposer stack 608 may provide very short interconnect lengths, in the range of 1 to 5 μm through the interposer interconnects 606. The through silicon via interposer stack 608 also allows die size optimization for yield improvement and significant performance enhancement.

It has also been discovered that the use of the through silicon via interposer stack 608 with the interposer interconnects 606 provides high data transmission bandwidth while reducing power due to less losses to heat. The reduced interconnect length proportionally reduces the line impedance reducing the losses.

Figure 7:
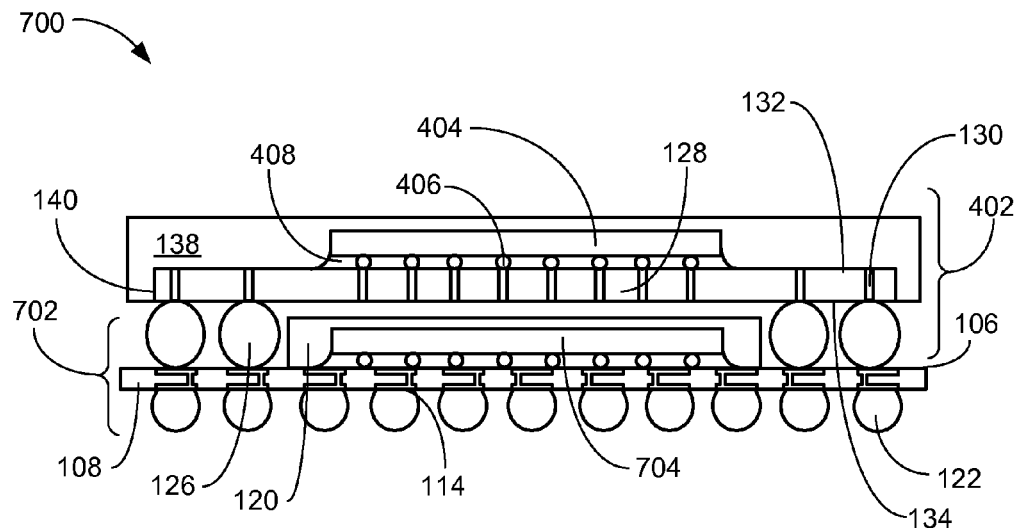
FIG. 7 is a cross-sectional view of an integrated circuit packaging system with package-on-package stacking, in a seventh embodiment of the present invention.

Referring now to FIG. 7, therein is shown a cross-sectional view of an integrated circuit packaging system 700 with package-on-package stacking, in a seventh embodiment of the present invention. The cross-sectional view of the integrated circuit packaging system 700 depicts a base package 702 with the top package 402 coupled to the contacts 114 on the component side 106 of the substrate 108 by the stacked interconnects 126.

The base package 702 may include a base integrated circuit die 704, such as a flip chip integrated circuit die, coupled to the contacts 114 on the component side 106 of the substrate 108 by the chip interconnects 406. The molded base package body 120 may optionally encapsulate the base integrated circuit die 704, the chip interconnects 406, the underfill material 408, and a portion of the component side 106. Some of the contacts 114 on the component side 106 remain exposed.

The top package 402 may include the stacked interconnects 126. The through silicon via interposer 128, such as an integrated circuit die, having the through silicon vias 130 may be coupled to the stacked interconnects 126. The through silicon via interposer 128 may have the active side 132 and the back side 134. The active side 132 of the through silicon via interposer 128 may include integrated circuits (not shown).

The stacked integrated circuit die 404 may be mounted on the active side 132 by the chip interconnects 406. The underfill material 408 may be applied between the active side 132 and the stacked integrated circuit die 404. The stacked integrated circuit die 404 may be coupled through the through silicon vias 130 on the active side 132. The resulting circuit may electrically connect the stacked integrated circuit die 404, the through silicon via interposer 128, the base integrated circuit die 704, the system interconnects 122, or a combination thereof.

The top package body 138 may be formed by molding an epoxy molding compound to encapsulate the stacked integrated circuit die 136, the electrical interconnects 118, as well as the active side 132 and the vertical sides 140 of the through silicon via interposer 128. The top package body 138 leaves the back side 134 of the through silicon via interposer 128 exposed.

Figure 8:
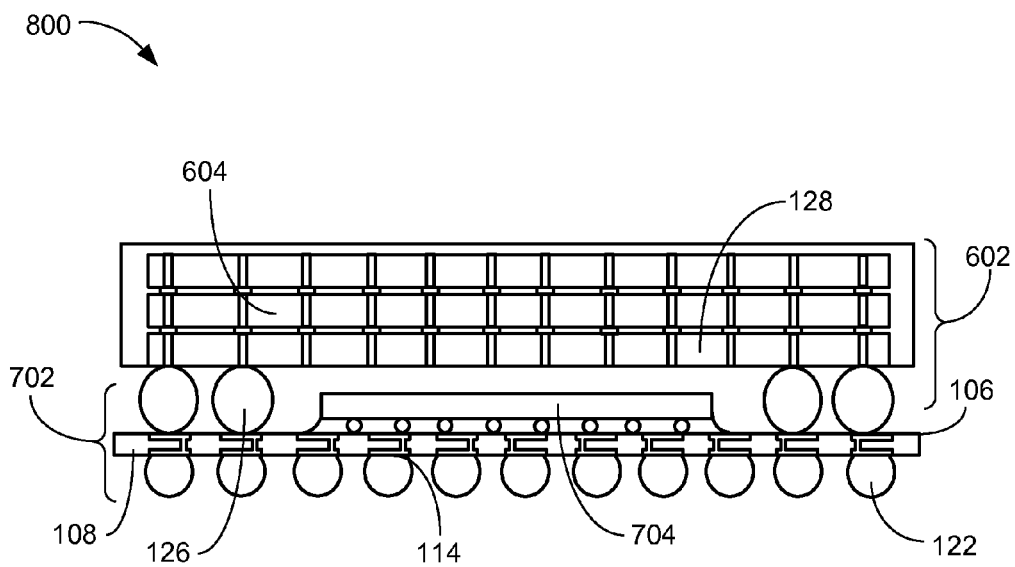
FIG. 8 is a cross-sectional view of an integrated circuit packaging system with package-on-package stacking, in an eighth embodiment of the present invention.

Referring now to FIG. 8, therein is shown a cross-sectional view of an integrated circuit packaging system 800 with package-on-package stacking, in an eighth embodiment of the present invention. The cross-sectional view of the integrated circuit packaging system 800 depicts the base package 702 with the top package 602 coupled to the contacts 114 on the component side 106 of the substrate 108 by the stacked interconnects 126.

The additional through silicon via interposer 604 may be electrically connected to the through silicon via interposer 128, the base integrated circuit die 704, the system interconnects 122, or a combination thereof.

Figure 9:
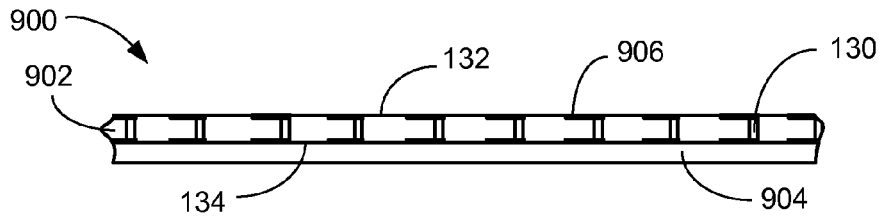
FIG. 9 is a cross-sectional view of a segment of a through silicon via wafer, in an embodiment of the present invention.

Referring now to FIG. 9, therein is shown a cross-sectional view of a segment of a through silicon via wafer 900, in an embodiment of the present invention. The cross-sectional view of a segment of the through silicon via wafer 900 depicts a through silicon via wafer 902 mounted on a carrier 904, such as a wafer support frame or a tape.

The through silicon via wafer 902 may have integrated circuitry disposed on the active side 132. Circuit traces 906 may couple the integrated circuits (not shown) to the through silicon vias 130 for distribution to the back side 134 allowing further attachment.

Figure 10:
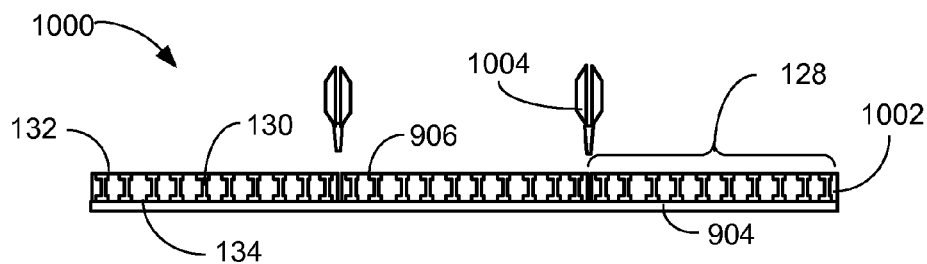
FIG. 10 is a cross-sectional view of a through silicon via wafer, in a singulation phase of manufacturing.

Referring now to FIG. 10, therein is shown a cross-sectional view of a through silicon via wafer 1000, in a singulation phase of manufacturing. The cross-sectional view of the through silicon via wafer 1000 depicts a wafer 1002 mounted on the carrier 904.

The wafer 1002 may have the through silicon vias 130 coupled between the circuit traces 906 on the active side 132 and the circuit traces 906 on the back side 134. A singulation device 1004, such as a saw or a shear, may separate the wafer 1002 into a group of the through silicon via interposer 128 while mounted on the carrier 904.

Figure 11:
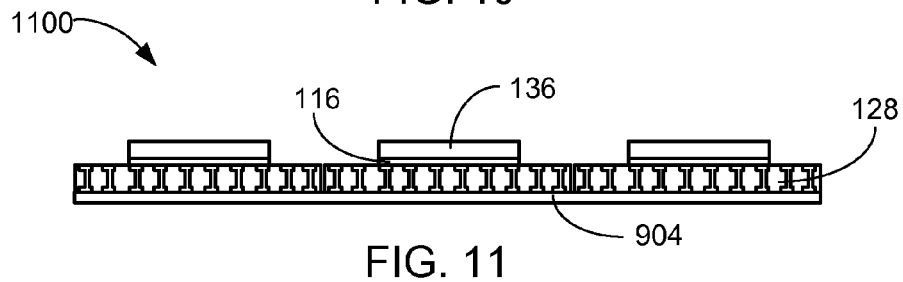
FIG. 11 is a cross-sectional view of a first top package assembly, in a die mounting phase of manufacturing.

Referring now to FIG. 11, therein is shown a cross-sectional view of a first top package assembly 1100, in a die mounting phase of manufacturing. The cross-sectional view of the first top package assembly 1100 depicts the group of the through silicon via interposer 128 mounted on the carrier 904. The stacked integrated circuit die 136 may be positioned on the through silicon via interposer 128. The adhesive 116 may be applied between the through silicon via interposer 128 and the stacked integrated circuit die 136.

Figure 12:
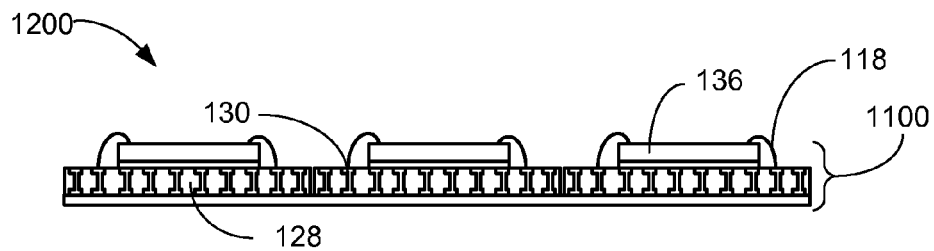
FIG. 12 is a cross-sectional view of a second top package assembly, in a wire bonding phase of manufacturing.

Referring now to FIG. 12, therein is shown cross-sectional view of a second top package assembly 1200, in a wire bonding phase of manufacturing. The cross-sectional view of the second top package assembly 1200 depicts the first top package assembly 1100 having the electrical interconnects 118 coupled between the stacked integrated circuit die 136 and the through silicon vias 130 of the through silicon via interposer 128.

Figure 13:
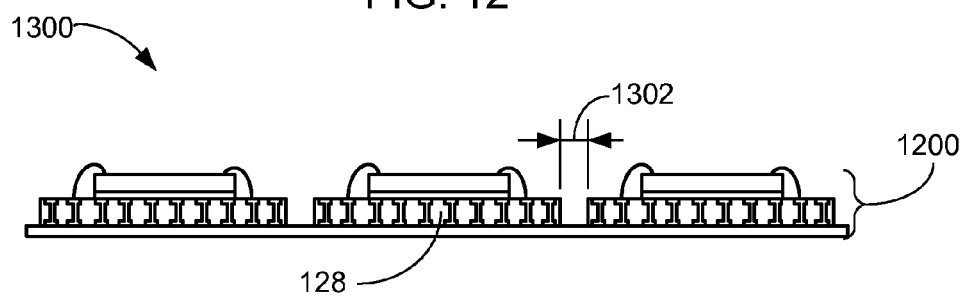
FIG. 13 is a cross-sectional view of a third top package assembly, in a separation phase of manufacturing.

Referring now to FIG. 13, therein is shown a cross-sectional view of a third top package assembly 1300, in a separation phase of manufacturing. The cross-sectional view of the third top package assembly 1300 depicts the second top package assembly 1200 having been separated while attached to the carrier 904.

A separation distance 1302 is sufficient to provide a molding channel between the through silicon via interposers 128. The separation distance 1302 may be provided without removing the through silicon via interposers 128 from the carrier 904.

Figure 14:
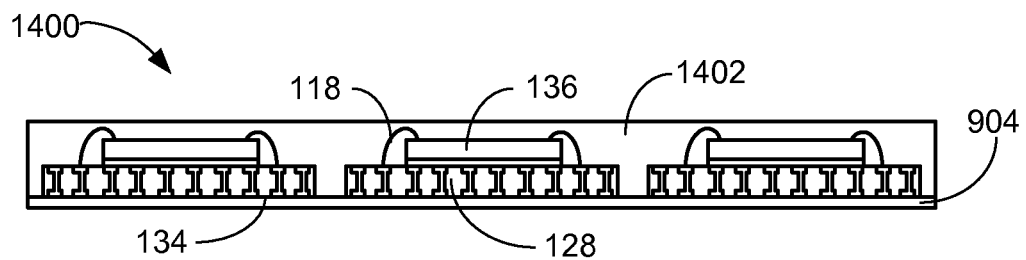
FIG. 14 is a cross-sectional view of a top package array, in a molding phase of manufacturing.

Referring now to FIG. 14, therein is shown a cross-sectional view of a top package array 1400, in a molding phase of manufacturing. The cross-sectional view of the top package array 1400 depicts a molding compound 1402 formed to encapsulate the through silicon via interposers 128, the stacked integrated circuit die 136, and the electrical interconnects 118. Only the back side 134 of the through silicon via interposers 128 is exposed from the molding compound 1402 because it is blocked by the carrier 904.

Figure 15:
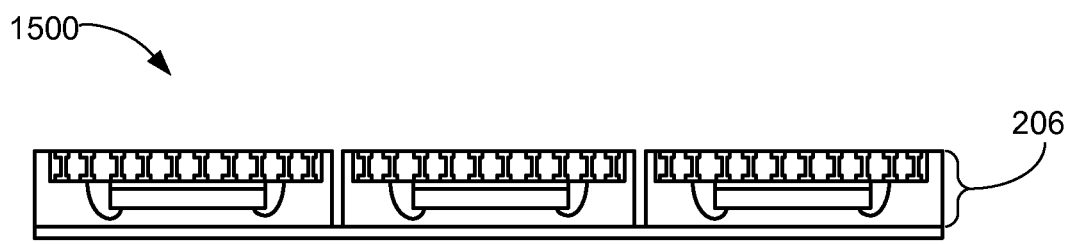
FIG. 15 is a cross-sectional view of an upper package assembly, in a singulation and mounting phase of manufacturing.

Referring now to FIG. 15, therein is shown a cross-sectional view of an upper package assembly 1500, in a singulation and mounting phase of manufacturing. The cross-sectional view of the upper package assembly 1500 depicts an array of the top package 206 having been singulated form the top package array 1400, of FIG. 14.

Figure 16:
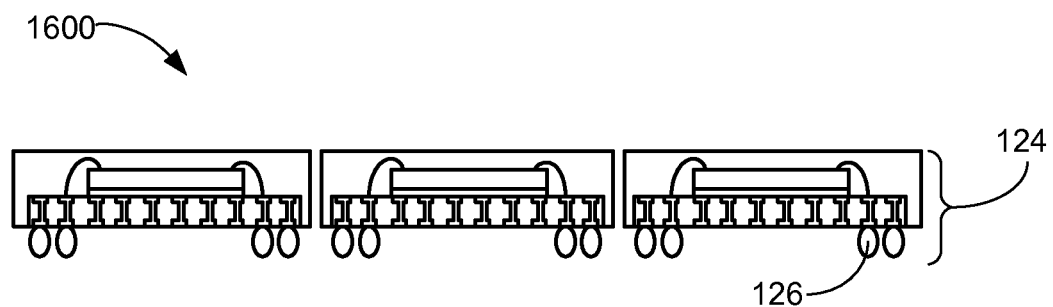
FIG. 16 is a cross-sectional view of an upper package array in an interconnect forming phase of manufacturing.

Referring now to FIG. 16, therein is shown a cross-sectional view of an upper package array 1600, in an interconnect forming phase of manufacturing. The cross-sectional view of the upper package array 1600 depicts the top packages 124 formed by attaching the stacked interconnects 126. The top package is now ready to be tested and mounted.

Figure 17:
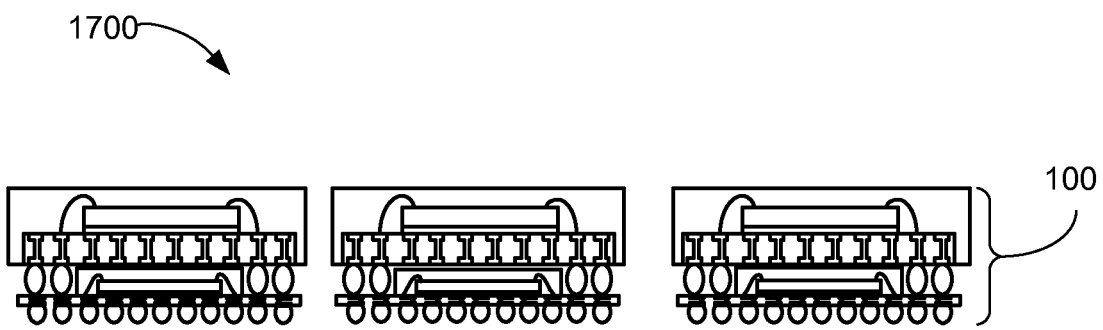
FIG. 17 is a cross-sectional view of an array of an integrated circuit packaging system, in a completed phase of manufacturing.

Referring now to FIG. 17, therein is shown a cross-sectional view of an array of an integrated circuit packaging system 1700, in a completed phase of manufacturing. The cross-sectional view of the array of the integrated circuit packaging system 1700 depicts an array of the integrated circuit packaging system 100 in a completed state and ready for assembly on the next level system (not shown).

Figure 18:
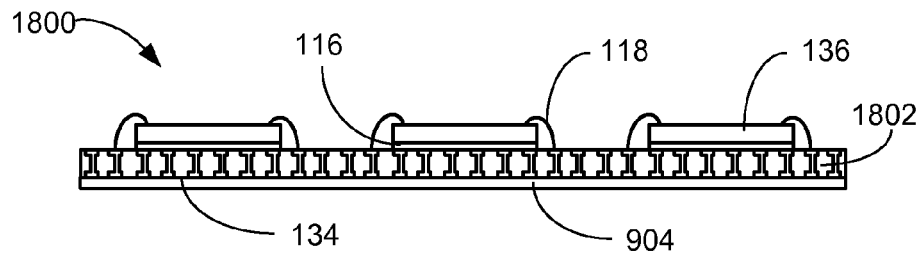
FIG. 18 is a cross-sectional view of a through silicon via wafer assembly, in a die mounting phase of manufacturing.

Referring now to FIG. 18, therein is shown a cross-sectional view of a through silicon via wafer assembly 1800, in a die mounting phase of manufacturing. The cross-sectional view of the through silicon via wafer assembly 1800, in an alternative manufacturing process, depicts a through silicon via wafer 1802 having the stacked integrated circuit die 136 mounted by the adhesive 116.

The stacked integrated circuit die 136 are positioned on the area that will be singulated in a later manufacturing step. The stacked integrated circuit die 136 are coupled to the through silicon via wafer 1802 by the electrical interconnects 118. The through silicon via wafer 1802 may be mounted on the carrier 904 in order to protect the back side 134 during processing.

Figure 19:
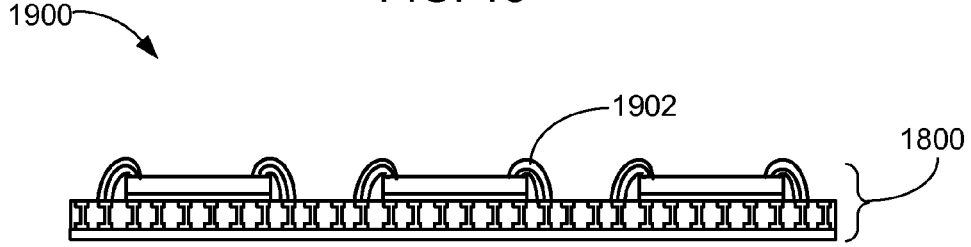
FIG. 19 is a cross-sectional view of a through silicon via wafer assembly, in a wire lock application phase of manufacturing.

Referring now to FIG. 19, therein is shown a cross-sectional view of a through silicon via wafer assembly 1900, in a wire lock application phase of manufacturing. The cross-sectional view of the through silicon via wafer assembly 1900 depicts the through silicon via wafer assembly 1800 having a protective layer 1902, such as a wire lock resin material, formed on the electrical interconnects 118.

Figure 20:
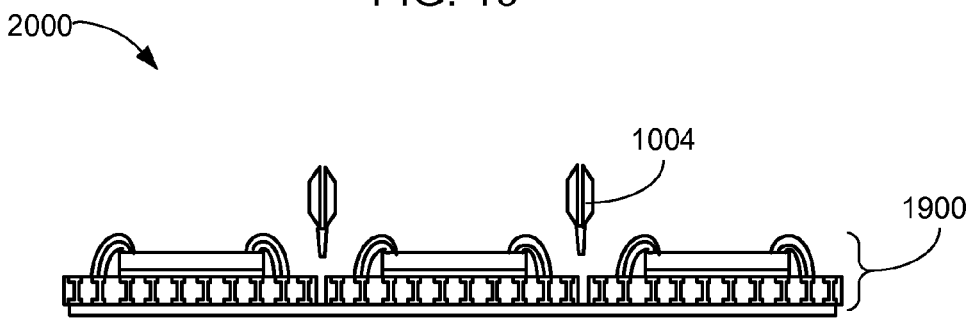
FIG. 20 is a cross-sectional view of a through silicon via wafer assembly, in a singulation phase of manufacturing.

Referring now to FIG. 20, therein is shown a cross-sectional view of a through silicon via wafer assembly 2000, in a singulation phase of manufacturing. The cross-sectional view of the through silicon via wafer assembly 2000 depicts the through silicon via wafer assembly 1900 after the through silicon via wafer assembly 1900 has been singulated by the singulation device 1004.

Figure 21:
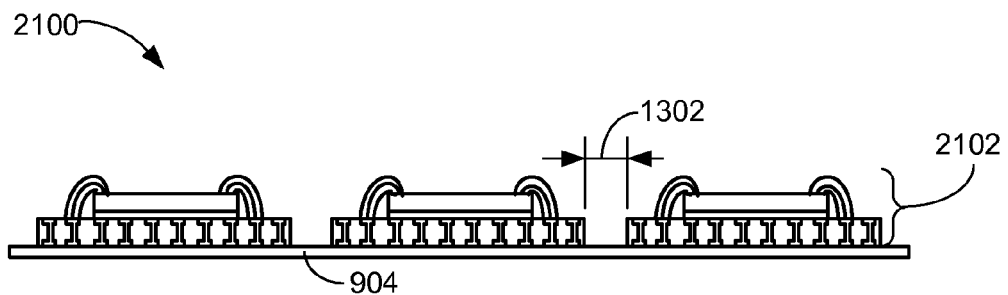
FIG. 21 is a cross-sectional view of a through silicon via wafer, in a separation phase of manufacturing.

Referring now to FIG. 21, therein is shown a cross-sectional view of a through silicon via wafer 2100, in a separation phase of manufacturing. The cross-sectional view of the through silicon via wafer 2100 depicts the singulated units of a top package assembly 2102 having been separated while attached to the carrier 904.

The separation distance 1302 is sufficient to provide a molding channel between each of the top package assemblies 2102. The separation distance 1302 may be provided without removing the top package assemblies 2102 from the carrier 904.

Figure 22:
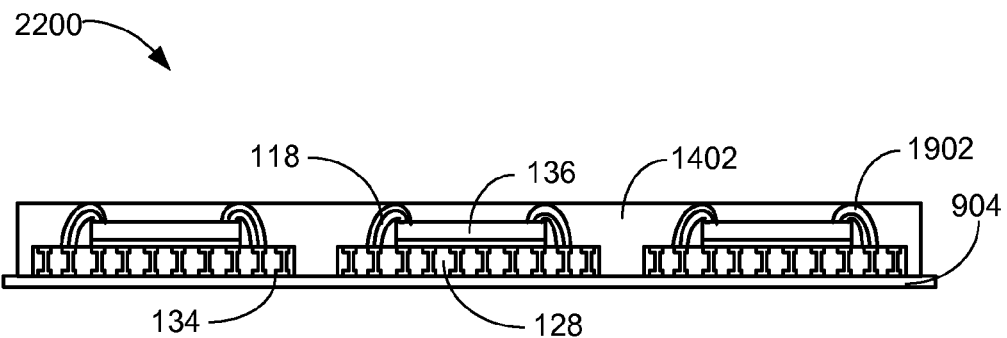
FIG. 22 is a cross-sectional view of a top package array, in a molding phase of manufacturing.

Referring now to FIG. 22, therein is shown a cross-sectional view of a top package array 2200, in a molding phase of manufacturing. The cross-sectional view of the top package array 2200 depicts the molding compound formed to enclose the stacked integrated circuit die 136, the wire lock resin material 1902, which surrounds the electrical interconnects 118, and all of the surfaces of the through silicon via interposer 128 except the back side 134. The back side 134 is blocked by the carrier 904.

Figure 23:
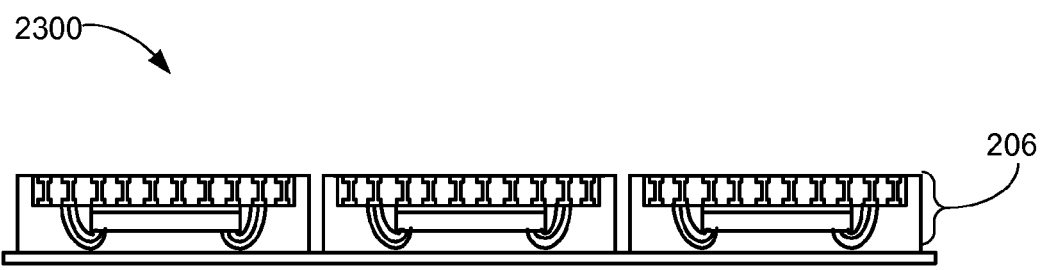
FIG. 23 is a cross-sectional view of an upper package assembly, in a mounting phase of manufacturing.

Referring now to FIG. 23, therein is shown a cross-sectional view of an upper package assembly 2300, in a mounting phase of manufacturing. The cross-sectional view of the upper package assembly 2300 depicts an array of the top package 206 having been singulated form the top package array 2200, of FIG. 22.

Figure 24:
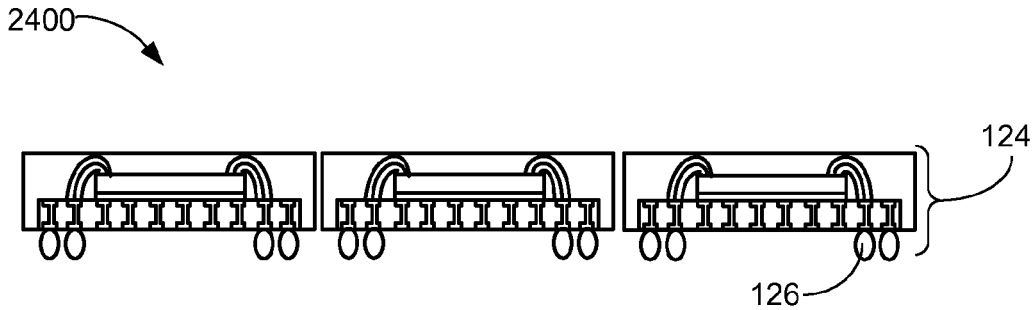
FIG. 24 is a cross-sectional view of an upper package assembly, in the interconnect forming phase of manufacturing.

Referring now to FIG. 24, therein is shown a cross-sectional view of an upper package assembly 2400, in the interconnect forming phase of manufacturing. The cross-sectional view of the upper package assembly 2400 depicts the top packages 124 formed by attaching the stacked interconnects 126. The top package is now ready to be tested and mounted.

Figure 25:
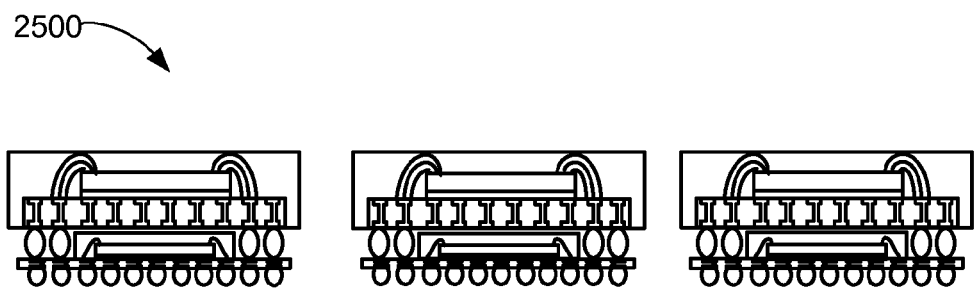
FIG. 25 is a cross-sectional view of an array of the integrated circuit packaging system, in a completed phase of manufacturing.

Referring now to FIG. 25, therein is shown a cross-sectional view of an array of the integrated circuit packaging system 100, in a completed phase of manufacturing. The cross-sectional view of an array of the integrated circuit packaging system 100 depicts an array of the integrated circuit packaging system 100 in a completed state and ready for assembly on the next level system (not shown).

Figure 26:
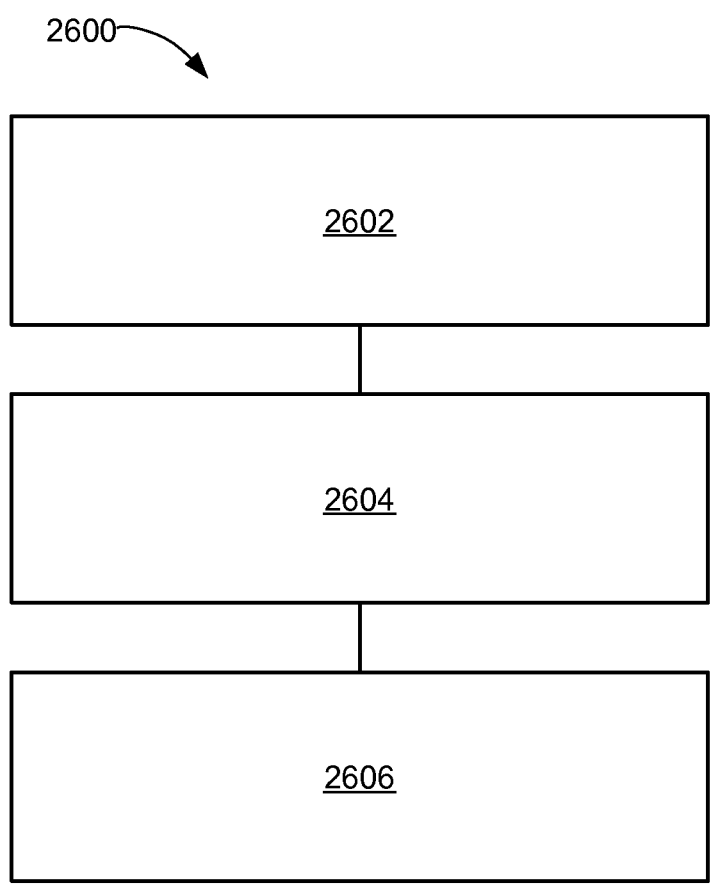
FIG. 26 is a flow chart of a method of manufacture of an integrated circuit packaging system in an embodiment of the present invention.

Referring now to FIG. 26, therein is shown a flow chart of a method 2600 of manufacture of an integrated circuit packaging system in an embodiment of the present invention. The method 2600 includes: forming a top package including: providing a through silicon via interposer having a through silicon via; coupling a stacked integrated circuit die to the through silicon via, and testing a top package in a block 2602; forming a base package including: providing a substrate, coupling a base integrated circuit die to the substrate, and testing a base package in a block 2604; and coupling a stacked interconnect between the top package and the base package in a block 2606.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package-on-package stacking systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a top package including:
        providing a through silicon via interposer having a through silicon via, coupling a stacked integrated circuit die to the through silicon via, and forming a top package body on the stacked integrated circuit die and the through silicon via interposer with a back side of the through silicon via interposer exposed from the top package body;

attaching a stacked interconnect directly on and between the through silicon via and a substrate; and forming a base package including:
coupling a base integrated circuit die to the substrate, and forming a molded base package body encapsulating the stacked interconnect, a top portion of the stacked interconnect exposed and protruding from the molded base package body.

2. The method as claimed in claim 1 wherein forming the top package body includes molding an epoxy molding compound on the stacked integrated circuit die and the through silicon via interposer.

3. The method as claimed in claim 1 further comprising:
forming a stacked integrated package containing the stacked integrated circuit die; and
coupling an electrical interconnect between the stacked integrated package and the through silicon via interposer.

4. The method as claimed in claim 1 wherein forming the top package includes:
coupling an additional through silicon via interposer to the through silicon via interposer by an interposer interconnect.

5. The method as claimed in claim 1 wherein coupling the stacked interconnect between the top package and the base package includes forming an electrical connection among the stacked integrated circuit die, the through silicon via interposer, the base integrated circuit die, or a combination thereof.

6. A method of manufacture of an integrated circuit packaging system comprising:
forming a top package including:
providing a through silicon via interposer having a through silicon via including providing integrated circuits on the through silicon via interposer,
coupling a stacked integrated circuit die to the through silicon via, and
forming a top package body on the stacked integrated circuit die and the through silicon via interposer with a back side of the through silicon via interposer exposed from the top package body;
attaching a stacked interconnect directly on and between the through silicon via and a substrate; and
forming a base package including:
coupling a base integrated circuit die to a component side of the substrate including coupling a contact on the component side to the base integrated circuit die, and
forming a molded base package body encapsulating the stacked interconnect, a top portion of the stacked interconnect exposed and protruding from the molded base package body.

7. The method as claimed in claim 6 wherein forming the molded base package body includes forming the molded base package body on the base integrated circuit die and the substrate.

8. The method as claimed in claim 6 further comprising:
forming a stacked integrated package containing the stacked integrated circuit die including molding an integrated package body enclosing the stacked integrated circuit die; and
coupling an electrical interconnect between the stacked integrated package and the through silicon via interposer.

9. The method as claimed in claim 6 wherein forming the top package includes:
coupling an additional through silicon via interposer to the through silicon via interposer by an interposer interconnect including forming a through silicon via interposer stack; and
forming a molding compound on the through silicon via interposer, the additional through silicon via interposer, and the interposer interconnect including leaving a back side of the through silicon via interposer exposed.

10. The method as claimed in claim 6 wherein coupling the stacked interconnect between the top package and the base package includes forming an electrical connection among the stacked integrated circuit die, the through silicon via interposer, the base integrated circuit die, a system interconnect or a combination thereof.

11. An integrated circuit packaging system comprising:
a top package including:
a through silicon via interposer having a through silicon via,
a stacked integrated circuit die coupled to the through silicon via, and
a top package body on the stacked integrated circuit die and the through silicon via interposer with a back side of the through silicon via interposer exposed from the top package body;
a stacked interconnect attached directly on and between the through silicon via and a substrate; and
a base package including:
a base integrated circuit die coupled to the substrate, and
a molded base package body encapsulating the stacked interconnect, a top portion of the stacked interconnect exposed and protruding from the molded base package body.

12. The system as claimed in claim 11 wherein the top package body includes an epoxy molding compound molded on the stacked integrated circuit die and the through silicon via interposer.

13. The system as claimed in claim 11 further comprising:
a stacked integrated package contains the stacked integrated circuit die; and
an electrical interconnect between the stacked integrated package and the through silicon via interposer.

14. The system as claimed in claim 11 wherein the top package includes:
an additional through silicon via interposer coupled to the through silicon via interposer by an interposer interconnect.

15. The system as claimed in claim 11 wherein the stacked interconnect between the top package and the base package includes an electrical connection among the stacked integrated circuit die, the through silicon via interposer, the base integrated circuit die, or a combination thereof.

16. The system as claimed in claim 11 further comprising:
an integrated circuit on an active side of the through silicon via interposer;
a contact on a component side of the substrate coupled to the base integrated circuit die; and solder balls, solder columns, or stud bumps coupled between the through silicon via and the contact on the component side.

17. The system as claimed in claim 16 wherein the molded base package body is on the base integrated circuit die and the substrate.

18. The system as claimed in claim 16 further comprising:
a stacked integrated package contains the stacked integrated circuit die includes the stacked integrated circuit die enclosed by an integrated package body; and
an electrical interconnect between the stacked integrated package and the through silicon via interposer.

19. The system as claimed in claim 16 wherein the top package includes:
an additional through silicon via interposer coupled to the through silicon via interposer by an interposer interconnect includes a through silicon via interposer stack formed; and
a molding compound on the through silicon via interposer, the additional through silicon via interposer, and the interposer interconnect includes a back side of the through silicon via interposer exposed.

20. The system as claimed in claim 16 wherein the stacked interconnect between the top package and the base package includes an electrical connection among the stacked integrated circuit die, the through silicon via interposer, the base integrated circuit die, a system interconnect or a combination thereof.

* * * * *